US006927433B2

(12) United States Patent
Hynecek

(10) Patent No.: US 6,927,433 B2
(45) Date of Patent: Aug. 9, 2005

(54) ACTIVE PIXEL IMAGE SENSOR WITH TWO TRANSISTOR PIXEL, IN-PIXEL NON-UNIFORMITY CORRECTION, AND BOOTSTRAPPED RESET LINES

(75) Inventor: Jaroslav Hynecek, Allen, TX (US)

(73) Assignee: ISETEC, Inc, Allen, TX (US)

( * ) Notice: Subject to any disclaimer, the term of this patent is extended or adjusted under 35 U.S.C. 154(b) by 834 days.

(21) Appl. No.: 09/892,426

(22) Filed: Jun. 28, 2001

(65) Prior Publication Data

US 2003/0002093 A1 Jan. 2, 2003

(51) Int. Cl.[7] ........................ H01L 31/062; H01L 31/113
(52) U.S. Cl. ........................................ 257/292; 257/291
(58) Field of Search ........................ 257/290, 291, 257/292

(56) References Cited

U.S. PATENT DOCUMENTS 5,241,575 A * 8/1993 Miyatake et al. ............ 377/60
5,861,621 A * 1/1999 Takebe et al. ............ 250/214 R
6,163,023 A * 12/2000 Watanabe ................. 250/208.1
6,587,146 B1 * 7/2003 Guidash ..................... 348/308

* cited by examiner

Primary Examiner—Ngân V. Ngô
(74) Attorney, Agent, or Firm—John E. Vandigriff

(57) ABSTRACT

A CMOS Active Pixel Image Sensor is formed by only two transistors. The sensor may be fabricated with very small pixel sizes, which have only two metal contacts in them, have in-pixel offset non-uniformity correction, and bootstrapped reset lines. These features are achieved by employing the transistor body effect as the main photo-generated charge sensing means. The bootstrapped reset lines allow the sensor to operate at low bias voltages. Additional embodiments of the invention include: single line for addressing the pixels, column-clamping circuits to prevent the forward biasing of pixel's p-n junctions and trench isolation to minimize the pixel size.

6 Claims, 9 Drawing Sheets

ACTIVE PIXEL IMAGE SENSOR WITH TWO TRANSISTOR PIXEL, IN-PIXEL NON-UNIFORMITY CORRECTION, AND BOOTSTRAPPED RESET LINES

FIELD OF THE INVENTION

The present invention relates to solid-state image sensors and specifically to Active Pixel CMOS image sensors that have only two transistors in each pixel.

BACKGROUND OF THE INVENTION

State of the art CMOS image sensors have typically three or more transistors per pixel and are addressed and reset with two or more row lines. The pixels are also supplied with a power supply line and the output is obtained through a column sense line.

A typical circuit schematic diagram 101 of a standard CMOS pixel is shown in FIG. 1. As light impinges on the pixel photodiode 102, the diode is discharged and the resulting voltage of node 111 is supplied to the gate of the sensing transistor 103. When a particular row "Yn" is ready to be addressed, the addressing signal is applied to line 108, which turns the transistor 104 on. This connects the signal appearing on the source of the transistor 103 through the interconnect 107 to column line 112. The current source load 113 loads the column sense line "Xm". After the sensing is completed, the reset line 109 is pulsed, which resets the node 111 through the reset transistor 105 to the original level.

The whole cycle of sensing and resetting is periodically repeated when the sensor is used in a movie mode or is terminated just after one cycle when the sensor is used in a still picture mode. The drain of the reset transistor 105 is connected together with the drain of the sense transistor 103, and further through the interconnect 106 to the Vdd bus line 110. Separate lines for the reset and Vdd are also possible. The voltage waveform that appears on the node 111 is shown in the graph 201 in FIG. 2. When the reset pulse 204 is applied to the pixel, the node voltage is reset to level 205 that corresponds to dark signal. The light impinging on the photodiode 102 gradually discharges the node causing the node voltage to follow an approximately linear line 202 assuming that the light intensity is constant. When an address pulse 203 is applied to the pixel, the source voltage is sensed and delivered to column processing circuits. The new reset pulse 204 then restores the pixel original dark level 205. More information about Active Pixel Image (APS) Sensor design and operation can be found in the paper: "CMOS Image Sensor: Electronic Camera On a Chip" Eric Fossum published in the IEDM Technical Digest 1995 pp. 17–25. Additional information is also available in the U.S. Pat. No. 5,471,575 to Fossum at al.

APS image sensors have advantages in low power consumption, high speed, require only low bias voltages, and can be produced with low cost. However, the complexity of the pixel design leads to a sacrifice of some light collecting area, which ultimately results in lower QE. Another disadvantage is in pixel-offset non-uniformities that are caused by the threshold variations of pixel transistors. The resulting pixel signal has to be processed to remove these non-uniformities. Pixels in each column can share the column processing circuitry, however, these circuits typically require at least two large capacitors for the offset subtraction and data storage, which may consume a significant portion of the chip area. Another problem resulting from the complex pixel circuitry is the need for several contacts between the transistor gates, source and drain regions, and metal busing. The pixel circuit 101, shown in FIG. 1, requires at least three contacts. The contacts are also consuming pixel area, obstruct light, and prevent pixel size reduction beyond a certain limit. It is therefore desirable to reduce the pixel complexity and more importantly to reduce the number of in-pixel contacts. It is also desirable to simplify the pixel-offset non-uniformity processing circuits and minimize the number of large signal storage capacitors in each column.

It is the purpose of this invention to teach how to overcome the above-described limitations and how to achieve, small pixel size, fewer transistors per pixel, and fewer in-pixel contacts, and to teach how to compensate pixel offset non-uniformities by storing the corrective signal in the pixel itself. The prior art does not show how to design an Active Pixel CMOS image sensor with a small pixel size that has only two transistors per pixel and only two in-pixel contacts. The prior art does not teach how to compensate for pixel offset non-uniformities by storing the error-compensating signal in the pixel itself. Finally the prior art does not teach how to improve the image sensor performance at low biasing voltages by bootstrapping the reset gate signal.

SUMMARY OF THE INVENTION

The present invention provides an Active Pixel CMOS image sensor that has only two transistors in each pixel, in-pixel offset non-uniformity correction, and bootstrapped reset lines. The reduced number of active pixel elements leads to higher Quantum Efficiency (QE) and smaller pixel size. The unique pixel row addressing and reset technique that uses only a single line further improves the sensor's QE. Separate column lines for the pixel output and reset reference allow for efficient compensation of pixel-offset non-uniformities. The pixel-offset non-uniformities are individually detected after each photo-generated signal has been read out. Special array column or array external processing circuits compute the corresponding pixel non-uniformity error-compensating signal and supply it back through the reset line to each pixel. As a result the photo-generated signal is always referenced to an absolute reference level free of any pixel-offset error. This type of non-uniformity correction thus reduces the number of column capacitors, normally needed for the standard non-uniformity correction and data storage, since the offset compensation is stored in the pixel itself. This technique significantly reduces the chip size and eventually the cost of the sensor.

These and other objects are achieved by using the body effect of p-type transistor as the main photo-signal sensing means. The n-well region containing the p-type transistor is reset to a reference voltage by a second n-type pixel transistor and then left floating. Impinging light creates electron-hole pairs and collected electrons are changing potential of the n-well. The potential changes modulate the threshold of the p-type transistor and these changes then represent the pixel output signal. The reset reference for each pixel is adjustable individually to compensate for the intrinsic p-type transistor threshold variations. This feature, when activated, effectively cancels the pixel-offset non-uniformities.

Another embodiment of the invention includes incorporation of trench isolation into each pixel. The trench isolation allows reducing the transient regions between the p-type and the n-type doping regions within the pixel and between the pixels of the array. This in turn leads to reduction of pixel size.

Yet additional embodiment of the invention includes the stacked double poly reset line that generates bootstrapped reset signal for the n-well reset transistor. This allows resetting the n-well to a higher voltage level, which increases the pixel output voltage swing and thus the overall sensor Dynamic Range. This feature is important when low bias voltages are required to operate the sensor.

The main advantage of the above-described pixel structure is that it contains only two transistors and consequently requires only two contacts to the array bus lines. The n-type transistor resets the n-well without the need for in-pixel metal interconnects and thus the pixel does not need additional contacts. This leads to an aggressive pixel size reduction without any significant sacrifice in the sensor sensitivity and QE.

BRIEF DESCRIPTION OF DRAWINGS

The invention will be described in detail in the following description of preferred embodiments with reference to the following figures wherein:

FIG. 6a shows a simplified cross section for the pixel of the invention. The cross section is taken through the line 5—5 indicated in FIG. 5a;

DETAILED DESCRIPTION OF PREFERRED EMBODIMENTS

Figure 3A:
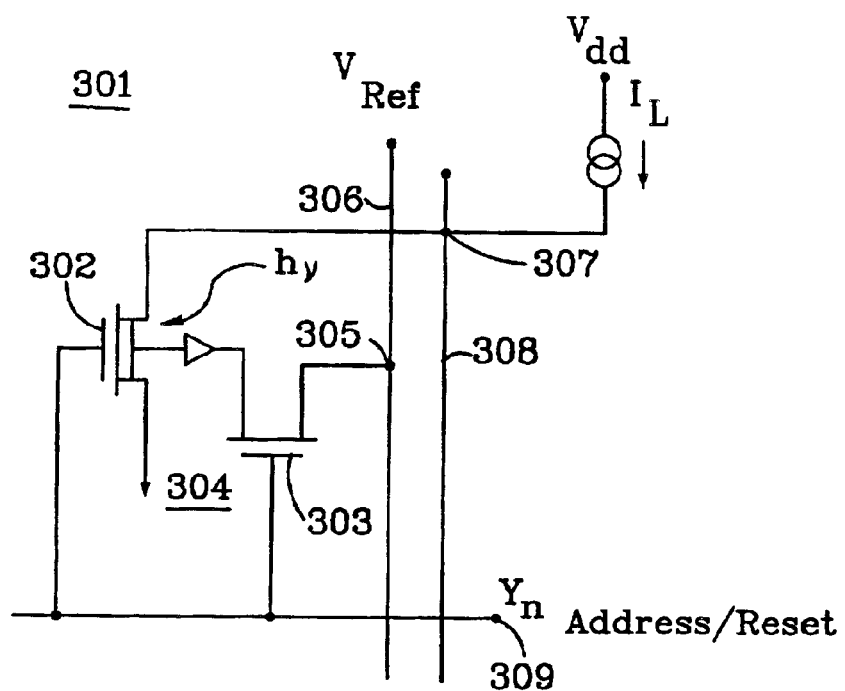
FIG. 3a shows a simplified circuit diagram for the pixel of the invention that contains only two transistors, one addressing line, and two column lines.
Figure 3B:
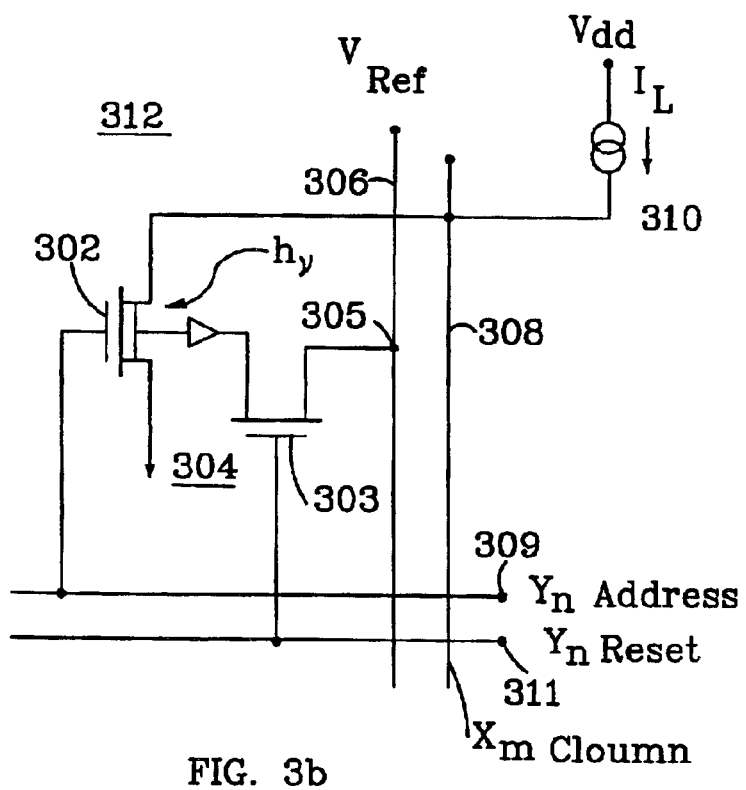
FIG. 3b shows a simplified circuit diagram for the pixel of the invention that contains only two transistors, address line, independent reset line, and two column lines.
Figure 4:
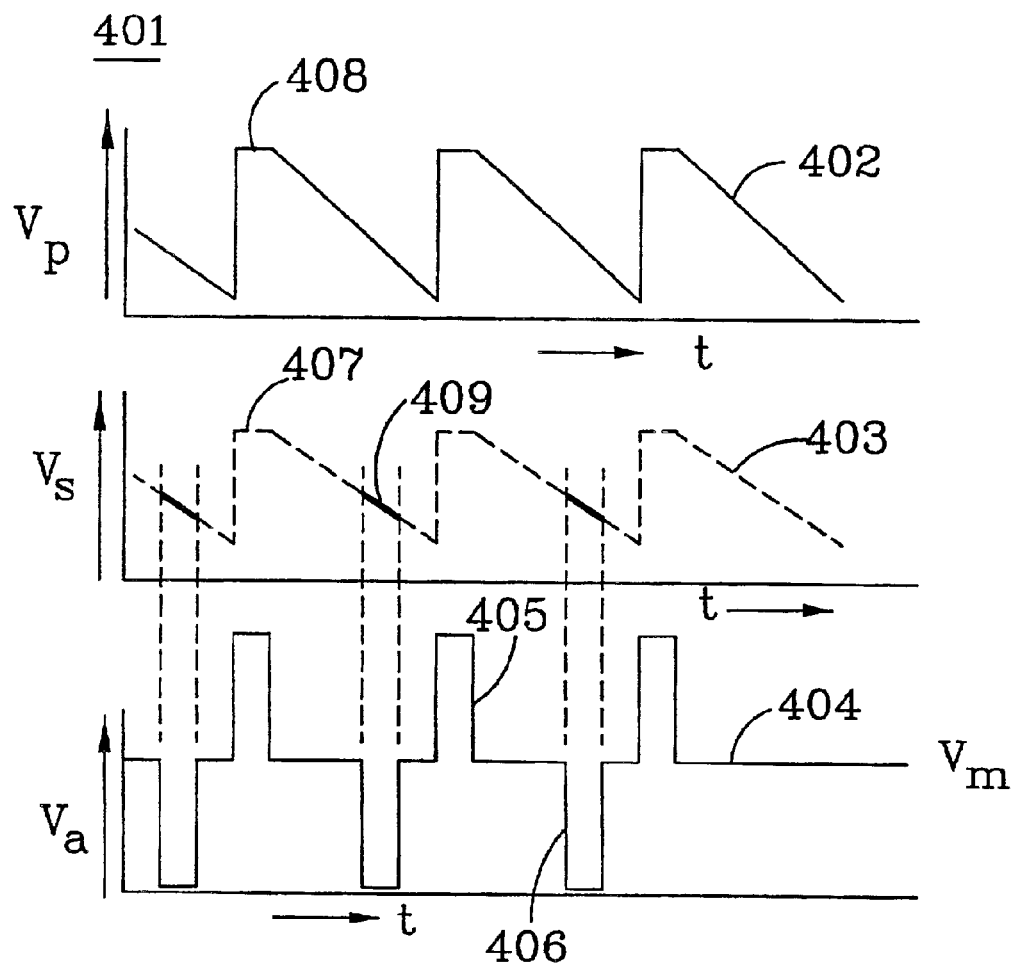
FIG. 4 shows a timing diagram for the pixel of the invention that indicates relative positions of the sense and reset pulses, and separate graphs of voltage waveforms appearing on the n-well and on the pixel output during the pixel operating cycle are also given.

Simplified circuit diagrams 301 and 312 for two versions of the CMOS pixel of the invention are shown in FIG. 3a and FIG. 3b. The pixel consists of one p-type transistor 302 that is formed in a standard CMOS n-type well 304 and one n-type transistor 303. The drain of a p-type transistor is connected to p-type substrate by extending the p+ drain region over the n-well edge. This feature eliminates the need for a metal interconnect. The source of transistor 302 is connected to column signal bus line 308 by the interconnect 307. The column signal bus line is shared by all the pixels in the same column and is loaded by a suitable current source 310. N-type transistor 303 is used for the reset, and when turned on, it resets the n-well 304 to a potential that is present on the bus line 306 at that moment. Each pixel in the same column can thus be reset to a different reset level since the pixels are reset at different times. The interconnect 305 connects the drain of transistor 303 to column reset bus line 306. The n+ source of transistor 303 is connected to the n-well 304 similarly as that of the p-type transistor, which is by extending the n+ diffusion over the edge of the p-region or p-well. Gates of both transistors 302 and 303 are connected to the same address line 309 even thou this is not always necessary since separate lines for the address transistor 309 and the reset transistors 311 can be provided as shown in FIG. 3b. Since the transistors are of a different conductivity type, it is possible to distinguish the reset from addressing in case of the common line just by applying different polarity pulses. The reset is accomplished by a positive pulse excursion while the addressing is accomplished by a negative pulse excursion. For more clarity, the signal waveforms appearing on the n-well 304 and on the source node of transistor 302 are shown in the graph 401 in FIG. 4. The n-well 304 is reset to a potential level 408 by the reset pulse 405, and photo-generated carriers causes the level to drop along the line 402 providing that photon flux is constant during this interval.

The n-well potential change is affecting the threshold voltage of transistor 302 through the body effect phenomenon and the potential of transistor 302 source is changed accordingly starting from the reset level 407 along the line 403 as indicated by the dotted curve if it were turned on. However, the transistor is turned off, since its gate is not addressed when biased to an intermediate $V_m$ level 404. When address pulse 406 is applied, the transistor turns on and the potential level 409 is supplied to the column sense line as the pixel output.

Figure 5A:
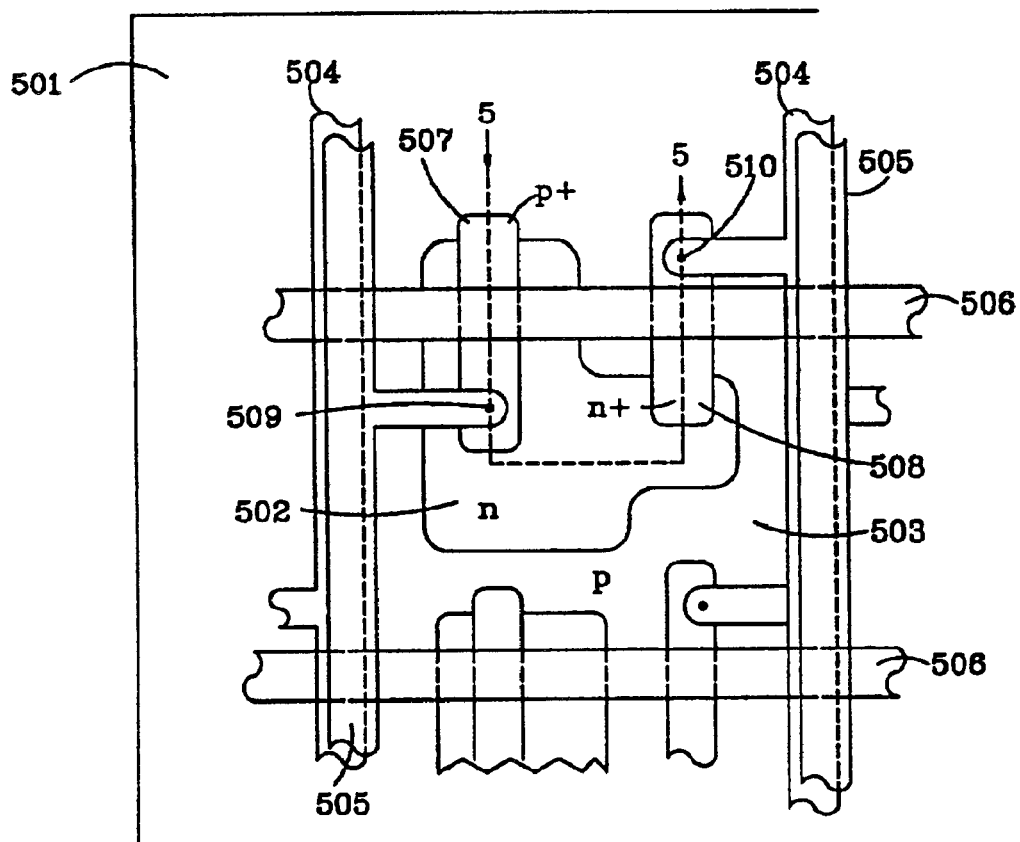
FIG. 5a shows a plan view of the pixel layout for the pixel of the invention with two metal bus line contacts to the pixel's active elements.

An example of one possible pixel layout 501 is shown in FIG. 5a. Regions 506 represent address lines that are typically formed from a single polysilicon layer. As will be explained later, the lines can also be formed as stacked structures of two polysilicon layers separated by a suitable dielectric. This is not visible in the drawing.

Region 502 indicates the n-well. The P-type substrate or p-well is the region 503, which is everything outside the n-well 502. Region 507 defines a p-type transistor with its drain overlapping the n-well 502 to facilitate the drain to substrate connection as explained previously. Similarly, region 508 defines a n-type transistor with its source overlapping the n-well 502 to make the required connection. Metal bus lines 504, for reset, and 505, for signal, are slightly offset, but this is only for the purpose of drawing clarity. In practice they may be located on top of each other and elsewhere in the pixel. Transistor contacts to corresponding bus lines are indicated in the drawing by dots 509 and 510.

Figure 6A:
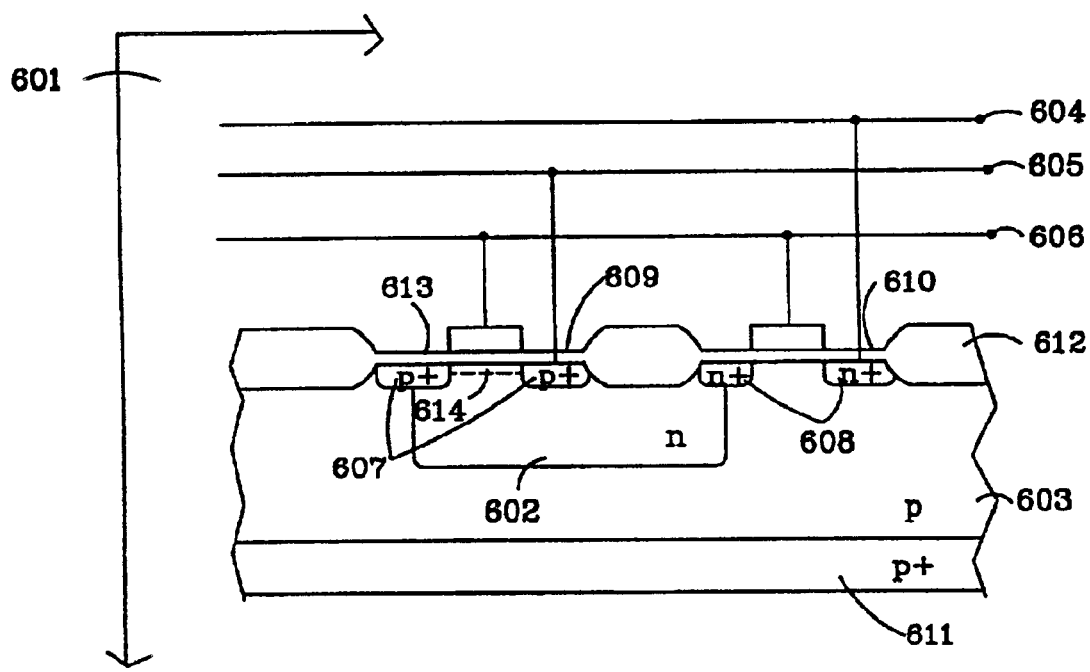

For more clarity a pixel cross section 601 is shown in FIG. 6a. The cross section is taken through the line 5—5 as indicated in FIG. 5a. Structures 602 through 610 correspond directly to regions 502 through 510 in FIG. 5a. Region 611 is the p+ type substrate on which the p-type bulk material is epitaxially grown. Other substrate materials and material combinations are possible as can be easily surmised by those skilled in the art. Transistor's active regions with thin gate oxide 613 and inactive field regions 612 with thick oxide are also standard in the industry. Other doped regions, to prevent parasitic channel formations, transistor punch-through, and other unwanted phenomena, are not indicated in the drawing since they are not essential for this invention and are well known to those skilled in the art of CMOS technology. One important detail, however, is the region 614 under the p-type transistor gate 614. This region includes a combination of suitable p-type and n-type doping layers that optimize the p-type transistor threshold and at the same time maximize its body effect. Particular doping levels and energies are easily obtained by simulations and experiments and are unique to each device design. It is therefore not practical to specify them here in any more detail.

Figure 5B:
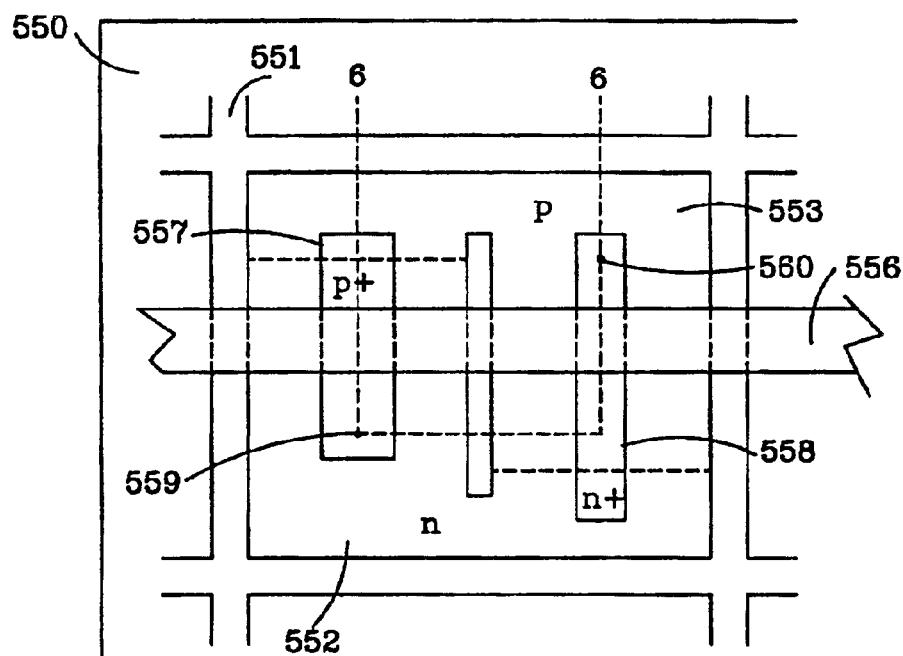
FIG. 5b shows the plan view of the pixel layout for the pixel of the invention that is using trench isolation to reduce the pixel size.
Figure 6B:
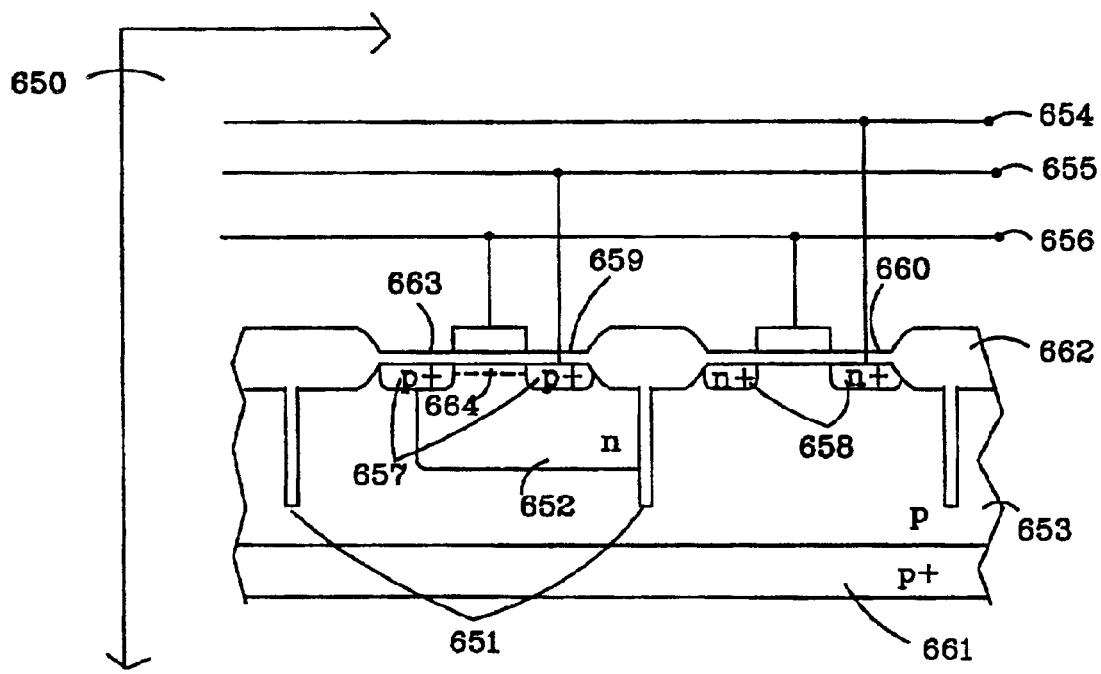
FIG. 6b shows a simplified cross section, taken through 6—6 of FIG. 5b, for the pixel of the invention that is using trench isolation.

Another example of possible pixel layout is shown in FIG. 5b. In this embodiment the trench isolation regions 551 are used to minimize the transition regions between the p-well 553 and n-well 552 doping. The trench also reduces the n-well capacitance, which increases the pixel conversion factor. The p-channel transistor 557 and the n-channel transistor 558, with the common gate 556, correspond to the same structures in FIG. 5a. The metal buss lines have been omitted in this figure, but the contact holes 559 and 560 are indicated. The simplified device cross-section taken through the line 6—6, in FIG. 5b, is shown on the drawing in FIG. 6b. The structures 602 through 614 in FIG. 6a correspond directly to structures 652 through 664 in FIG. 6b.

Figure 1:
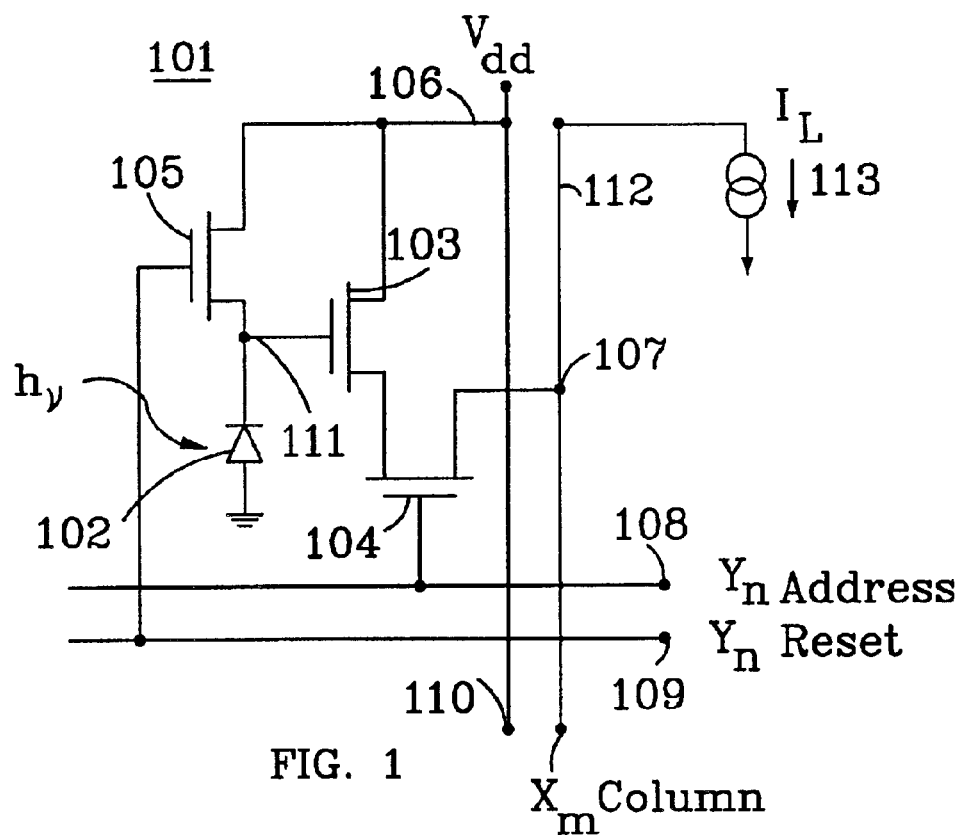
FIG. 1 shows a simplified circuit diagram of the prior art active pixel that consists of three transistors and a photodiode.
Figure 2:
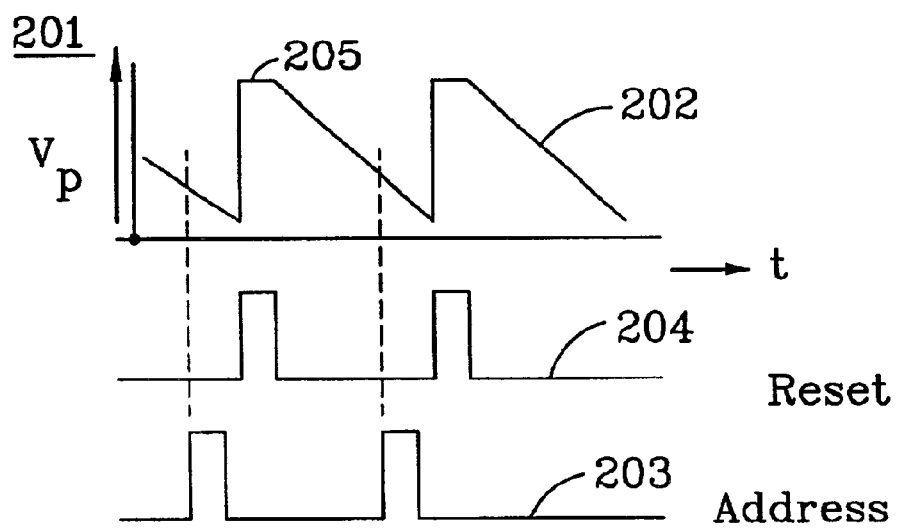
FIG. 2 shows a timing diagram for the reset and address pulses that are applied to the prior art pixel whose circuit diagram is given in FIG. 1, and includes a graph of the signal waveform that appears on the photodiode during the course of the pixel operation.

When CMOS image sensors are required to operate at low bias voltages, the threshold voltage of the reset transistor reduces the voltage swing of node 111 (FIG. 1) or 304 (FIG. 3a). The node is typically reset to a level that is approximately a threshold voltage below $V_{dd}$.

Figure 7:
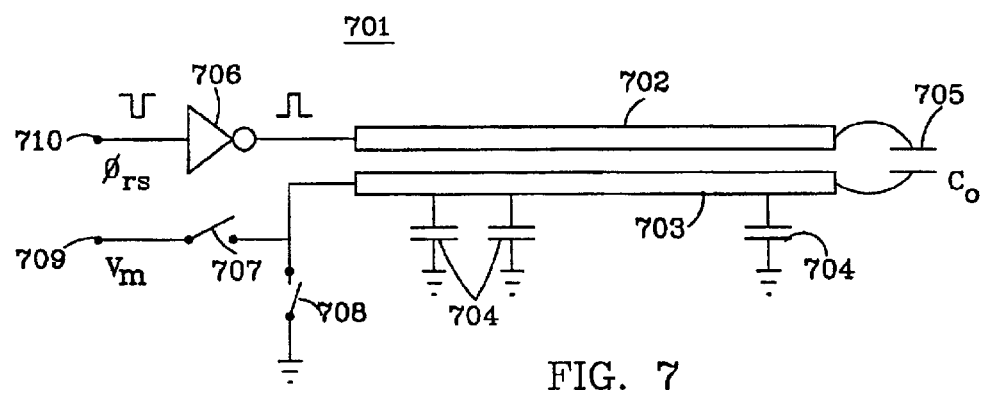
FIG. 7 shows a simplified schematic diagram for the bootstrapped driver.

A simplified schematic diagram 701, shown in FIG. 7, illustrates a bootstrapping technique that can minimize this problem and is particularly suitable for the pixel of the invention. During the pixel integration time, switch 707 is on and the gate bus of pixel transistors 703 is kept at an intermediate potential level Vm. For the reset, switch 707 is turned off, and reset pulse 710 is applied to the input of CMOS driver 706. The output from driver 706 then drives the line 702. Line 702 is located directly on top of the line 703, and is separated from it by a suitable dielectric. This arrangement forms a strong capacitive coupling between these lines. The coupling capacitance 705 is typically much larger than all the pixel gate capacitances 704 added together, which leads only to a small pulse amplitude attenuation. When the reset pulse is applied, the full reset pulse amplitude, starting from the level $V_m$, appears on the gate bus 703. No pixel dynamic range is sacrificed and nodes 111 (FIG. 1) or 304 (FIG. 3) can thus be fully reset to $V_{dd}$ or at least close to this level. The pixel addressing is accomplished simply by turning the switch 707 momentarily off and the switch 708 momentarily on.

Figure 8:
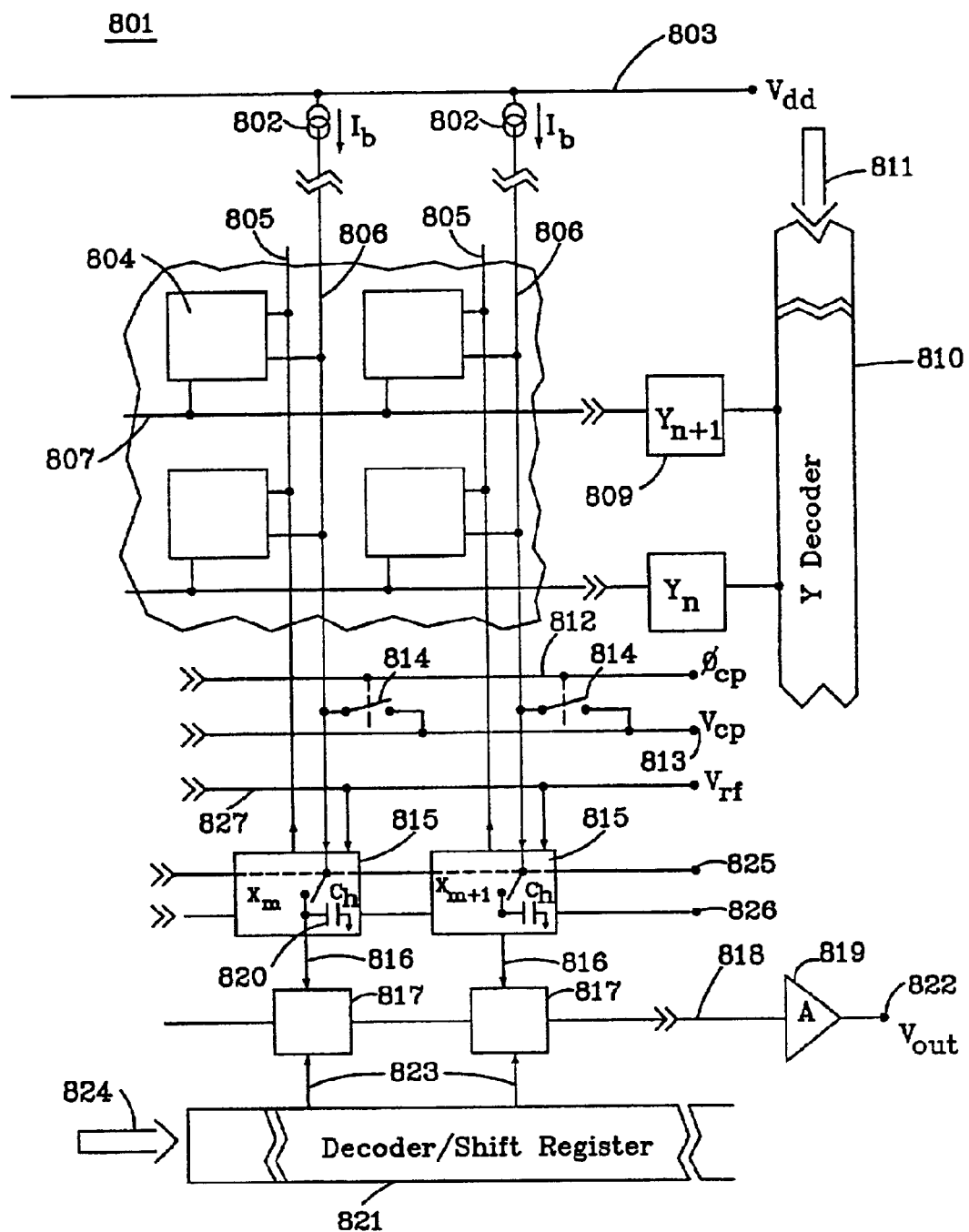
FIG. 8 shows the block diagram for the section of a complete image sensor array that incorporates the pixels of the invention with the pixel offset correction circuits are shown block diagram form.

For completeness a simplified block diagram 801 of a CMOS image sensor that includes the pixels of the invention is given in FIG. 8. FIG. 8 shows only a 2×2 sub array of pixels 804 and block diagrams of essential peripheral circuits. Current sources 802 located at the top of the array edge are biasing the column signal lines 806. Vdd is supplied to the current sources through a common Vdd line 803. The current sources can be switched off when not in use to save power, but this feature is not indicated in the diagram. Column reset lines 805 together with the column signal lines 806 interface directly with the column signal processing circuit modules 815. The circuit modules are also connected to the reset reference voltage line 827; the strobe clock line 825, and the error-enable clock line 826. The processed column signal, that is stored on the column circuit block capacitors 820, is supplied via interconnects 816 to horizontal switches 817.

The horizontal switches are consecutively turned on and off by the command signals received from the horizontal scan decoder 821 via the lines 823. Sometimes it is advantageous to replace the horizontal scan decoder by a shift register. The input into the horizontal scanner is received through bus lines 824. The sequential pixel output appears on the horizontal sense line 818 and is amplified and buffered by the output amplifier 819 that drives the chip output terminal 822. The array vertical scanning is accomplished by decoder 810, which supplies the necessary control signals to line drivers 809 and finally through them to pixel address lines 807. The vertical scanner receives its input through bus 811. An important element of the array peripheral circuits is the column-clamping switch 814. The primary function of the switch is to keep the column signal lines from drifting to a high bias level, and start forward biasing the pixel's p-n junctions when there is no pixel addressed. A suitable clamping bias is supplied to all the switches via line 813, and the switches are controlled by a command signal supplied via line 812.

Figure 9:
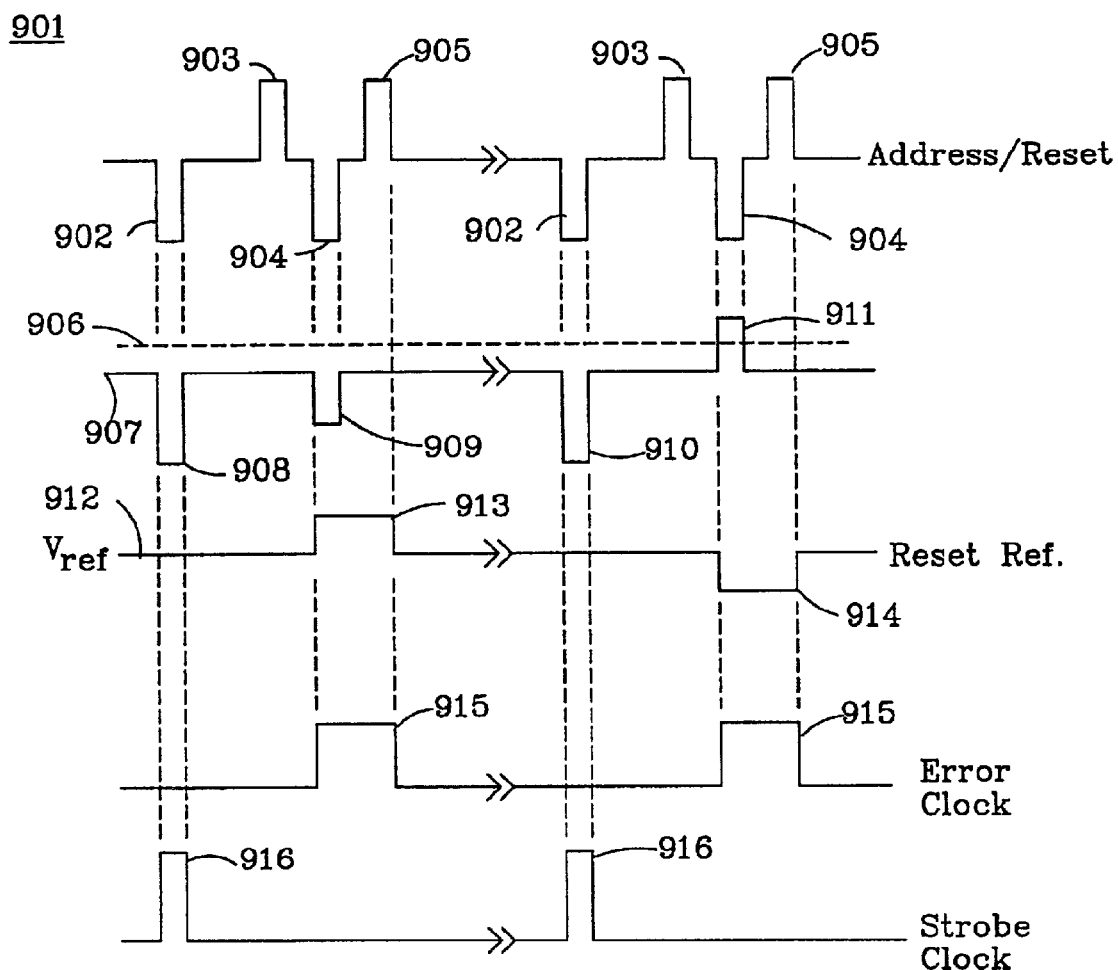
FIG. 9 shows a timing chart of the image sensor array shown in FIG. 8, and a graph of the column signal waveform is shown with the details that indicate where the pixel-offset signal is being sensed.

A simplified timing diagram 901 that includes some of the array's essential control signals is shown in FIG. 9. The pixel addressing pulse 904 connects the pixel output form one row of pixels to the corresponding column sense lines. Prior to this moment, sense lines were clamped to the level 907. The column sense lines always remain clamped to this level when no addressing pulses are applied. Addressing pulses cause the column sense lines to change their potential to a new level 908. The level 908 is subsequently sampled by pulses 916 and stored on holding capacitors 820 (FIG. 8) in the column signal processing circuits for a later scan and horizontal readout. In the next step reset pulse 903 is applied to the pixels followed by a new same-address pulse 904. The reset pulse 903 resets pixels to level 912. Since all charge from the pixels in the addressed row was removed by the reset, only dark levels 909 now appear on the column sense lines. The column error-processing circuits activated by pulse 915 process these levels and generate the reset level correction signal 913. The second reset pulse 905 then resets the pixels again to the new offset correcting reset levels. If the pixels were addressed again the column signal would be at the level 906, which is a common reference for all the pixels in the array. The above-described process continues for the next row of pixels in the column, which generate different output levels 910 and also different dark levels 911. The corresponding reset corrections 914 have now, for example, a different polarity since the level 911 was above the level 906. This process thus sets all the pixels in the array to an identical dark reference, which removes all the unpleasant dark signal variations from the sensor image.

Figure 10:
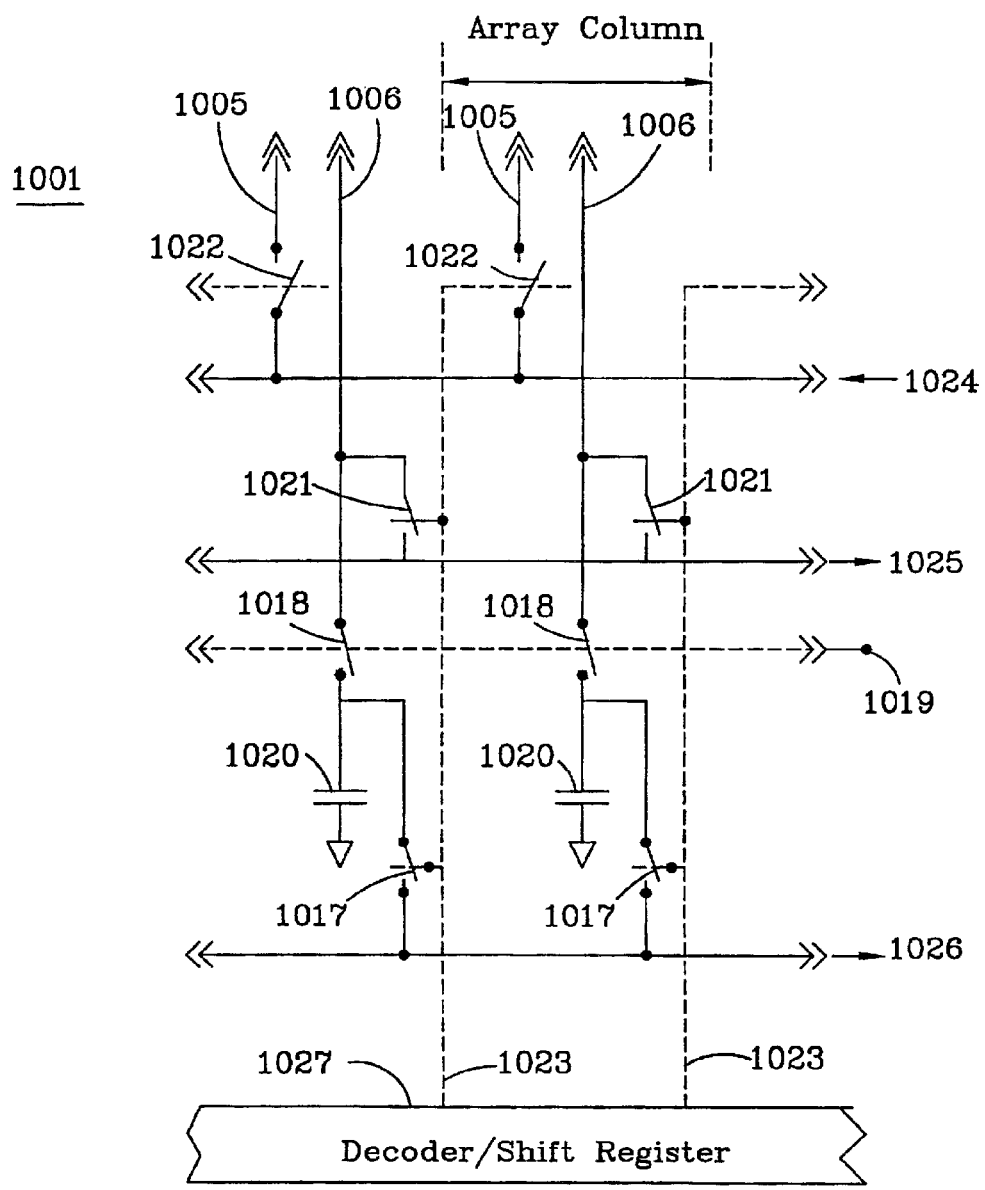
FIG. 10 shows the circuit diagram for the column switches that allow sensing the reset error signal and computing the reset level correction externally to the array, and the reset level bias correction that is supplied back to the corresponding column reset busses.

Another embodiment of the column signal processing circuitry 1001 is shown on the circuit diagram in FIG. 10.

When the image sensor pixel has a small size, there is not enough room available within the column pitch to accommodate all the required pixel non-uniformity correction circuitry. The circuit schematic diagram shown in FIG. 10 provides a solution to this problem. Both the signal and the reset error are scanned column by column and supplied to the processing bloc that is located near the image sensor array or entirely off chip. The error-processing block then supplies the correction signals back to the array. In this case the error processing circuit is only one for all the columns in the array and can be as complicated as needed or can even be using sophisticated software programmable DSP when off chip option is selected. As the individual columns are scanned, the corrections are loaded back to the proper columns of the array. A suitable wiring of switches 1022 to the horizontal scanner can easily accommodate the delay that might be encountered in the external error correcting circuits. The function of this system can be understood as follows: After the row of pixel is addressed the column signal is stored on the capacitors 1020 by turning the switches 1018 momentarily on. This is accomplished by applying a short pulse to the line 1019. After that the selected row of pixels is reset to a reference voltage supplied to the column-reset lines 1005 by switches not shown in the drawing. The same row of pixel is addressed again, which causes the zero signals to appear on the columns 1006 where it becomes stored. The horizontal scanner 1027 then simultaneously turns the switches 1021 and 1017 momentarily on via the control lines 1023, and supplies the signal and the error data to the sense lines 1026 and 1025, and, at the same time, the externally computed correction to the reset level is supplied to the column reset line 1005 of the previous column. The correction is supplied via the bus line 1024 and the switches 1022. If more delay is needed for computing the reset error, the wiring lines 1023 that control the reset column line switches 1022 can skip over several columns rather than only as indicated in FIG. 10.

Having described preferred embodiments of novel semiconductor Active Pixel CMOS image sensor with Two-Transistor Pixel, In-Pixel Non-uniformity Offset Correction, and Bootstrapped Reset Lines, which are intended to be illustrative and not limiting, it is noted that modification and variations can be made by persons skilled in the art in light of the teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by Letters Patent is set forth in the appended claims.

What is claimed is:

1. An Active Pixel CMOS image sensor device including at least one pixel circuit, comprising:

at least one transistor of a first conductivity type; and
at least one transistor of a second conductivity type, said transistor of the second conductivity type being used for resetting the body of the transistor of the first conductivity type.

2. The Active Pixel CMOS image sensor according to claim 1, wherein at least one pixel is sensing photo-generated charge by means of modulation of transistor threshold using transistor threshold body effect.

3. The device according to claim 1, wherein at least one p-type and one n-type transistor share a common gate bus line.

4. The device according to claim 1, wherein a separate bus line is provided to at least one pixel to supply a reset voltage, and wherein the reset voltage may be changed depending on the pixel.

5. The device according to claim 4, including an array of pixels in a column, and wherein the reset voltage is changed depending on pixel address within a column of pixels of the array to compensate for the pixel threshold differences along the said column of pixels.

6. The device according to claim 3, wherein the common gate bus line consists of a stack of at least two conductor layers separated by a dielectric layer, the first layer of the stack being connected to pixel transistor gates, and said conductor layers of the stack being connected to respective driving circuits at the periphery of the pixel array.

* * * * *